US008217852B2

(12) United States Patent
Chang et al.

(10) Patent No.: US 8,217,852 B2

(45) Date of Patent: Jul. 10, 2012

(54) COMPACT LOADED-WAVEGUIDE ELEMENT FOR DUAL-BAND PHASED ARRAYS

(75) Inventors: Yueh-Chi Chang, Northborough, MA (US); Kenneth S. Komisarek, Manchester, NH (US); Gregory M. Fagerlund, Peabody, MA (US); Landon L. Rowland, Westford, MA (US); Kaichiang Chang, Northborough, MA (US); Benjamin L. Caplan, Medford, MA (US)

(73) Assignee: Raytheon Company, Waltham, MA (US)

( * ) Notice: Subject to any disclaimer, the term of this patent is extended or adjusted under 35 U.S.C. 154(b) by 587 days.

(21) Appl. No.: 12/492,453

(22) Filed: Jun. 26, 2009

(65) Prior Publication Data

US 2010/0328188 A1 Dec. 30, 2010

(51) Int. Cl.

| | |
|---|---|
| ***H01Q 1/50*** | (2006.01) |
| ***H01Q 21/00*** | (2006.01) |
| ***H01P 3/06*** | (2006.01) |
| ***H01P 1/00*** | (2006.01) |
| ***H03H 7/38*** | (2006.01) |

(52) U.S. Cl. ........ 343/893; 343/907; 343/860; 343/843; 333/26; 333/33

(58) Field of Classification Search .................. 343/893, 343/907, 843, 860; 333/26, 33–35

See application file for complete search history.

(56) References Cited

U.S. PATENT DOCUMENTS 3,761,943 A 9/1973 Harper et al.
3,942,138 A * 3/1976 Schaedla ..................... 333/21 R
4,144,506 A * 3/1979 McCammon et al. .......... 333/26
4,349,790 A * 9/1982 Landry ........................ 333/24.1
4,409,566 A 10/1983 Patton et al.
4,463,324 A 7/1984 Rolfs
4,689,627 A 8/1987 Lee et al.
4,870,426 A 9/1989 Lamberty et al.
5,122,390 A 6/1992 Rearick et al.
5,359,339 A * 10/1994 Agrawal et al. ............... 343/786
5,557,291 A 9/1996 Chu et al.
5,638,079 A 6/1997 Kastner et al.

(Continued)

OTHER PUBLICATIONS

Paul Wade, "Rectangular Waveguide to Coax Transition Design" Nov./Dec. 2006 QEX, 8 pages, http://www.arrl.org/qex/2006/11/wade.pdf.

(Continued)

*Primary Examiner* — Jacob Y Choi
*Assistant Examiner* — Amal Patel
(74) *Attorney, Agent, or Firm* — Daly, Crowley, Mofford & Durkee, LLP

(57) ABSTRACT

An array antenna is provided that operates at high-band and low-band, comprising a first array of high-band radiators and a second array of low-band radiators, each respective low-band radiator disposed so as to be interleaved between the high-band radiators so as to share an aperture with the high-band radiators. Each low-band radiator comprises a coaxial section, a dielectric section, a waveguide, and a planar section. The dielectric section is formed of a continuous piece of dielectric material and includes a hollow opening formed perpendicular to the coaxial section, and a plurality of step transitions, wherein at least one of the step transitions is disposed within and partially fills the waveguide operably coupled to the planar section. The planar section is oriented to the portion of high-band radiators such that the output of the respective low-band radiator is disposed between and within the spacing between adjacent high-band-radiators.

20 Claims, 7 Drawing Sheets

U.S. PATENT DOCUMENTS

| | | | |
|---|---|---|---|
| 6,097,265 A | 8/2000 | Chan et al. | |
| 6,175,333 B1 | 1/2001 | Smith et al. | |
| 6,323,819 B1 | 11/2001 | Ergene | |
| 6,606,073 B1 | 8/2003 | Visser | |
| 6,650,291 B1 | 11/2003 | West et al. | |
| 6,720,933 B2 | 4/2004 | Hanlin et al. | |
| 6,781,554 B2 | 8/2004 | Lee et al. | |
| 6,927,734 B2 * | 8/2005 | Serban et al. | 343/703 |
| 6,937,203 B2 | 8/2005 | Rao et al. | |
| 2002/0097109 A1 * | 7/2002 | du Toit et al. | 333/26 |
| 2006/0158371 A1 * | 7/2006 | Duivenvoorden | 342/124 |
| 2008/0246553 A1 | 10/2008 | Okamoto | |

OTHER PUBLICATIONS

"Microwave and Antenna Systems", 8 pages, http://www.maasdesign.co.uk/maas/Transitions/TRansitions.html, Sep. 18, 2009.

* cited by examiner

COMPACT LOADED-WAVEGUIDE ELEMENT FOR DUAL-BAND PHASED ARRAYS

FIELD OF THE INVENTION

Embodiments of the invention generally relate to devices, systems, and methods for providing antenna elements. More particularly, the invention relates to devices, systems and methods for structures and devices providing a compact and simple to manufacture element for dual-band phased array antennas.

BACKGROUND

Modern commercial and military systems such as radar systems, and satellite communication systems, often perform multiple functions that can require a plurality of different radar beams at different wavelengths. Examples of these functions include surveillance of targets and objects at various ranges/distances, air traffic control, navigation, weapons control, weather surveillance, satellite uplink and downlink signaling, telecommunications, and Internet communications. In many of the environments in which such systems are deployed, it can be difficult to provide multiple antennas to support the multiple different beams because of space and/or cost limitations. Consequently, it is advantageous to employ a phased array antenna in such environments.

As is well-known, a single phased-array antenna can simultaneously radiate and receive multiple radar beams, because of its control of the phase of multiple radiating elements. One complicating factor in design of phased arrays, however, is that many radar functions require simultaneous availability of beams spanning two or more radar bands. For example, long-range surveillance conventionally requires longer wavelengths (λ), e.g., S band, whereas precision-tracking and target-recognition radars generally operate most efficiently at shorter wavelengths, e.g., C band. Weapons control and Doppler navigation are typically performed at still shorter wavelengths, e.g., X band and Ku band. However, for systems that require wide scan angle such as ±60° from boresight, combining radiating elements of two bands into a single aperture is a real challenge because of the constraints on element spacing and size. Furthermore, providing isolation between the two bands can be difficult and, as further explained below, it is possible to have interference and cross-coupling between the beams of the two different bands.

Phased array designs are typically limited in element spacing and size to avoid grating lobes. For example, some conventional phased array elements are approximately λ/2 apart and can occupy the entire space allocated to an element in a wide angle scanned array. If such conventional elements are spaced at greater than λ/2 wavelengths, the power of the radar signals can divide and, at wide scan angles, grating lobes can occur: as the beam is scanned further from broadside, a point is reached at which a second symmetrical main lobe (grating lobe) is developed. This unwanted condition can reduce antenna gain by several decibels (dBs) due to the second lobe. For dual-band military applications in particular, grating lobes can be a problem because the broad frequency bandwidth requirements mean that at the high end of the frequency band, the elements may be spaced greater than λ/2. The presence of grating lobes can cause a radar system to produce ambiguous responses to a radar target. Such a radar system also can be more prone to interference.

Still another bandwidth issue for phased array designs is the problem of beam distortion with scan angle. Beam distortion with scan angle results in spread of the beam shape and a consequent reduction in gain known as "scan loss". For an ideal array element, scan loss is equal to the aperture size reduction (projected) in the scan direction, which varies based at least in part on the scan angle.

An additional complicating factor in the design of antenna elements, including elements for phased arrays, involves transitions between different types of transmission lines in the system. In many high frequency systems, it is necessary to implement part of the system in coaxial transmission lines and another part of the system in waveguide transmission systems. To transfer signals from one of these mediums to the other, a coaxial transmission line to waveguide adaptor (also referred to as a coax to waveguide transition) is provided. Waveguide to coax transitions are known in the art, where the waveguide is a thin rectangular member having conductive surfaces, and the coax includes an inner pin conductor and an outer conductor. Generally, the output of the transition contains the configuration of a conventional waveguide type transmission line; the input of the transition contains the structure of the conventional coaxial type transmission line containing a central conductor surrounded by a dielectric.

FIG. 1 is an illustration of a prior art design using a conventional waveguide to coaxial transition 12. Referring briefly to FIG. 1, the transition 12 is coupled to a coaxial connector 14 having a central conductor 16 surrounded by a dielectric material (not shown in FIG. 1). The impedance matching section 10 is connected to a waveguide 18, which is illustrated in FIG. 1 as being substantially rectangular with a tapered section. The waveguide 18 includes a first section 20 filled with air and a second section 22 filed with dielectric material, where the second section in this example embodiment includes a tapered portion 22A extending into the air section. Dielectric material is used to reduce the size of the waveguide and the tapers on both waveguide and dielectric sections are designed to ensure good impedance matching.

In known transition implementations from waveguide to the coax, such as the transition 12 shown in FIG. 1, the outer conductor (not shown) of the coax 14 is electrically connected to one conductive surface of the waveguide 18, and the inner conductor 16 of the coax 14 extends into the waveguide and sometimes is loaded with a small dielectric or metallic disk at the end to increase its capacitance for better impedance matching. The electromagnetic waves from the antenna impinge on the inner conductor 16 and induce a current that is directed to a circuit operably connected to the coax 14.

Still referring to FIG. 1, receiving antennas collect electromagnetic energy from the free space 23 for reception purposes, and a receiver or other processing circuit coupled to the antenna detects and processes the collected energy. For certain frequency bands, waveguides 18 direct the radiation that the antenna collects to the receiver or other processing circuit. The radiation generally travels in free space 23 through the waveguide 18, and is collected by a coaxial connection 14 that is electrically connected to the receiver circuit. Often, the receiver circuit and the waveguide 18 are very different in size, so the waveguide 18 includes an adapter 12 and/or one or more transitions to reduce its size from the antenna to the coaxial connection 14. The various transitions through the waveguide 18, including the transition from the air waveguide 20 to the coaxial connection 14, preferably are such that the transitions are impedance matched to limit the losses of the collected radiation to a minimum.

In addition, as shown in FIG. 1, the dielectric material 22 filling the waveguide helps to provide a further transition and impedance matching. As is known in the art, by filling the waveguide 18 with dielectric material 22 having a relative permittivity greater than 1, the width of the waveguide 18 can be reduced significantly in its operating band. To ensure a smooth transition and good impedance matching between open-air waveguide and dielectric-loaded waveguide, taper sections for both waveguide and dielectric are commonly used.

In known implementations, the coax-to-waveguide adaptors are typically larger than the space available in the phased array environment. Again, this is mainly due to the element spacing constraint to avoid grating lobes. Another challenge is that elements having a narrow aperture generally have a higher impedance and it is harder to provide an impedance match to free space over a large scan angle.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

It would be advantageous to be able to integrate low-band sensors into a high-band array so that all high and low-band elements share the same aperture while both bands could be scanned to wide angles. Such a dual-band system could provide greater flexibility for multi-function missions, reduce aperture area, and may allow re-use of back-end electronics. To achieve this integration, the low-band element preferably should be very compact to minimize interference to high-band performance. The low-band element also needs to have the desired wide scan angle performance over a broad bandwidth. No such an element is known to exist that meets these difficult requirements.

Previous design attempts for dual-band phased arrays have not been found to meet all of the necessary requirements for some applications. For example, in radar search and tracking applications, a wide scan angle (>60°) over a wide bandwidth (>15%) for both bands is required. One proposed design combines an annual ring microstrip (for low-band) with an open waveguide element (for high-band), including design examples for 15 GHz, and 20 GHz. However, for this design, like many others, there are limitations of high-band performance, because at high-band, the scan performance will be limited due to grating lobes.

A second requirement of the above exemplary application is the requirement that the array be capable of independently steering both antenna beams (i.e., the low-band and high-band beams). A third requirement is that there should be no blockage (i.e., physical interference) caused by one band to the other. For example, one known design for a dual-band array uses L-band dipoles embedded in front of an X-band aperture. However, it is possible that the dipoles can cause blockage to X-band, resulting in severe (and undesirable) interaction between L and X bands.

A final requirement of the above exemplary application is that such a design should be producible using proven manufacturing techniques with reasonable cost in production.

In one aspect, the invention provides an array antenna constructed and arranged to operate at a high-band wavelength $\lambda_H$ and a low-band wavelength $\lambda_L$, the antenna comprising a first array and a second array. The first array comprises a plurality of high-band radiators, each high-band radiator constructed and arranged to radiate at $\lambda_H$, at least a portion of the high-band radiators having a first predetermined spacing between each other. The second array comprises a plurality of low-band radiators, each respective low-band radiator in the plurality being disposed so as to be interleaved between the high-band radiators and being sized to fit within the first predetermined spacing so as to share an aperture with the high-band radiators, each low-band radiator having an input and output.

Each respective low-band radiator comprises a coaxial section, a dielectric section, a waveguide, and a planar section. The coaxial section is disposed at the input to the low-band radiator, the coaxial section being constructed and arranged to provide a coaxial connection adapted to receive radiated signals, wherein the coaxial connection comprises a coaxial conductor. The dielectric section is operably coupled to the coaxial section via the coaxial conductor, the dielectric section being formed of a continuous piece of dielectric material and cooperating with the coaxial section and a waveguide to provide a coaxial to waveguide transition.

The dielectric section comprises a first opening, a second opening, and a plurality of step transitions. The first opening is sized to receive the coaxial conductor. The second opening is formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening.

The plurality of step transitions is disposed after the first portion of the dielectric section, the plurality of step transitions cooperating to provide impedance matching and to reduce the height of the respective low-band radiator from a first height at the input to the respective low-band radiator to a second height at the output of the respective low-band radiator, wherein at least one of the step transitions is adapted to be disposed within the waveguide and to be operably coupled between the dielectric section and the planar section, wherein the at least one step transition partially fills an interior first portion of the waveguide at the first end, wherein at least a second portion of the waveguide adjacent to the first portion is filled with air, and wherein the size of the step transition that partially fills the waveguide is selected at least in part to provide impedance matching between the dielectric section and the waveguide.

The waveguide is operably coupled to the dielectric section, the waveguide having first and second ends, the first end being operably coupled to the dielectric section and the second end being operably coupled to the planar section.

The planar section is disposed at the output of the low-band radiator is operably coupled to the second end of the waveguide and is further operably coupled to at least a portion of the first array of high-band radiators, wherein the planar section is oriented to the portion of high-band radiators such that the output of the respective low-band radiator is disposed between and within the spacing between adjacent high-band-radiators, such that the low-band radiator and the high-band radiators share the same aperture.

In one embodiment of this aspect, the low-band radiator is constructed and arranged to have an overall height less than or equal to $0.06\lambda_L$, a width less than or equal to $0.5\lambda_L$, and a length less than or equal to $\lambda_L$. In another embodiment, the first predetermined spacing is selected to limit a scan loss of the antenna to less than 2.0 dB plus $\cos^{1.5}(\theta)$, where $\theta$ is the scan angle of the high-band array. In a further embodiment, the low-band elements are spaced a second predetermined spacing apart from each other, wherein the second predetermined spacing is selected to limit the scan loss of the antenna to less than 2.0 dB plus $\cos^{1.5}(\theta)$, where $\theta$ is the scan angle of the low-band array.

In a further embodiment, each high-band radiator has a side length and each low-band radiator has a height, wherein the height of the low-band radiator is approximately half the height of the high-band radiator.

In a still further embodiment, the plurality of step transitions further comprises first, second, and third step transitions. The first step transition is disposed near the second opening and spaced approximately $0.22\lambda_L$ from the coaxial portion that is coupled to the dielectric portion, the first step transition having a step down height of approximately $0.08\lambda_L$ and a length of approximately $0.47\lambda_L$. The second step transition is disposed adjacent to the first step transition, the second step transition having a step up height of approximately $0.02\lambda_L$ and a length of approximately $0.08\lambda_L$. The third step transition is disposed adjacent to the second step transition, the third step transition having a step down height of $0.04\lambda_L$ and a length of approximately $0.14\lambda_L$, wherein the third step transition corresponds to the step transition that is disposed within and partially fills the waveguide.

In still further embodiments, the waveguide has a cross-section wherein the width is at least approximately 7 times the height. The first portion of the dielectric section can have a length of approximately $0.22\lambda_L$. At least one of the orientation, lining and size of the second opening can be selected to provide impedance matching to the coaxial section. The antenna can be a phased array antenna.

In at least one embodiment, the high-band corresponds to a frequency range that is approximately 2.5 to 5 times the size of the frequency range of the low-band. The high-band wavelength and the low-band wavelength can each be associated with a respective one of the following frequency bands: X band, S band, L band, C band, Ku band, K band, Ka band, Q band, and mm band.

In one embodiment, at least one of the high-band radiating array and the low-band radiating array has a size and spacing enabling the antenna to be operable to scan at scan angles greater than or equal to sixty degrees from boresight with a bandwidth greater than or equal to 15%.

In another aspect, the invention provides an antenna element having an input and an output and comprising a coaxial section, a dielectric section, a waveguide, and a planar section. The coaxial section is disposed at the input, the coaxial portion being constructed and arranged to provide a coaxial connection adapted to receive radiated signals, wherein the coaxial connection comprises a coaxial conductor. The dielectric section is operably coupled to the coaxial section via the coaxial conductor, the dielectric section being formed of a continuous piece of dielectric material and cooperating with the coaxial section and a waveguide to provide a coaxial to waveguide transition. The dielectric section comprises a first opening, a second opening, and a plurality of step transitions.

The first opening is sized to receive the coaxial conductor. The second opening is formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening. The plurality of step transitions are disposed after the first portion of the dielectric section, the plurality of step transitions cooperating to provide impedance matching and reduce the height of the respective antenna element from a first height at the input to the antenna element to a second height at the output of the antenna element, wherein at least one of the step transitions is adapted to be disposed within the waveguide and to be operably coupled between the dielectric section and a planar section, wherein the at least one step transition partially fills an interior first portion of the waveguide at the first end, wherein at least a second portion of the waveguide adjacent to the first portion is filled with air, and wherein the size of the step transition that partially fills the waveguide is selected at least in part to provide impedance matching between the dielectric section and the waveguide.

The waveguide is coupled to the dielectric section, the waveguide having first and second ends, the first end operably coupled to the dielectric section and the second end operably coupled to a planar section. The planar section is disposed at the output, the planar section being operably coupled to the second end of the waveguide.

In one embodiment, the plurality of step transitions further comprises a first step transition disposed near the second opening and spaced approximately $0.22\lambda$ from the coaxial section that is coupled to the dielectric portion, the first step transition having a step down height of approximately $0.08\lambda$ and a length of approximately $0.47\lambda$; a second step transition disposed adjacent to the first step transition, the second step transition having a step up height of approximately $0.02\lambda$ and a length of approximately $0.08\lambda$; and a third step transition disposed adjacent to the second step transition, the third step transition having a step down height of $0.04\lambda$ and a length of approximately $0.14\lambda$, wherein the third step transition corresponds to the step transition that is disposed within and partially fills the waveguide.

The antenna element can be adapted to operate over at least a wavelength $\lambda$, wherein the antenna element is constructed and arranged to have an overall height less than or equal to $0.06\lambda$, a width less than or equal to $0.5\lambda$, and a length less than or equal to $\lambda$. At least one of the orientation, lining and size of the second opening can be selected to provide impedance matching to the coaxial section.

In a further aspect, the invention provides a coaxial to waveguide transition having first and second ends and comprising a coaxial section at the first end, a dielectric section, and a waveguide.

The coaxial section is constructed and arranged to provide a coaxial connection adapted to receive radiated signals, wherein the coaxial connection comprises a coaxial conductor. The dielectric section operably is coupled to the coaxial section via the coaxial conductor, the dielectric section being formed of a continuous piece of dielectric material and cooperating with the coaxial section and a waveguide to provide a coaxial to waveguide transition. The dielectric section comprises a first opening, a second opening, and a plurality of step transitions.

The first opening is sized to receive the coaxial conductor. The second opening is formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening. The plurality of step transitions is disposed after the first portion of the dielectric section, the plurality of step transitions cooperating to provide impedance matching and reduce the height of coaxial to waveguide transition from a first height at the first end to a second height at the second end, wherein at least one of the step transitions is adapted to be disposed within and to partially fill a waveguide operably coupled to the dielectric section, wherein the size of the step transition that partially fills the waveguide is selected at least in part to provide impedance matching between the dielectric section and the waveguide.

The waveguide is operably coupled to the dielectric section, the waveguide having first and second ends, the first end operably coupled to the dielectric section and the second end located at the output of the waveguide.

Details relating to this and other embodiments of the invention are described more fully herein.

BRIEF DESCRIPTION OF THE DRAWINGS

The advantages and aspects of the invention, as well as the invention itself, will be more fully understood in conjunction with the following detailed description and accompanying drawings, wherein.

Figure 1:
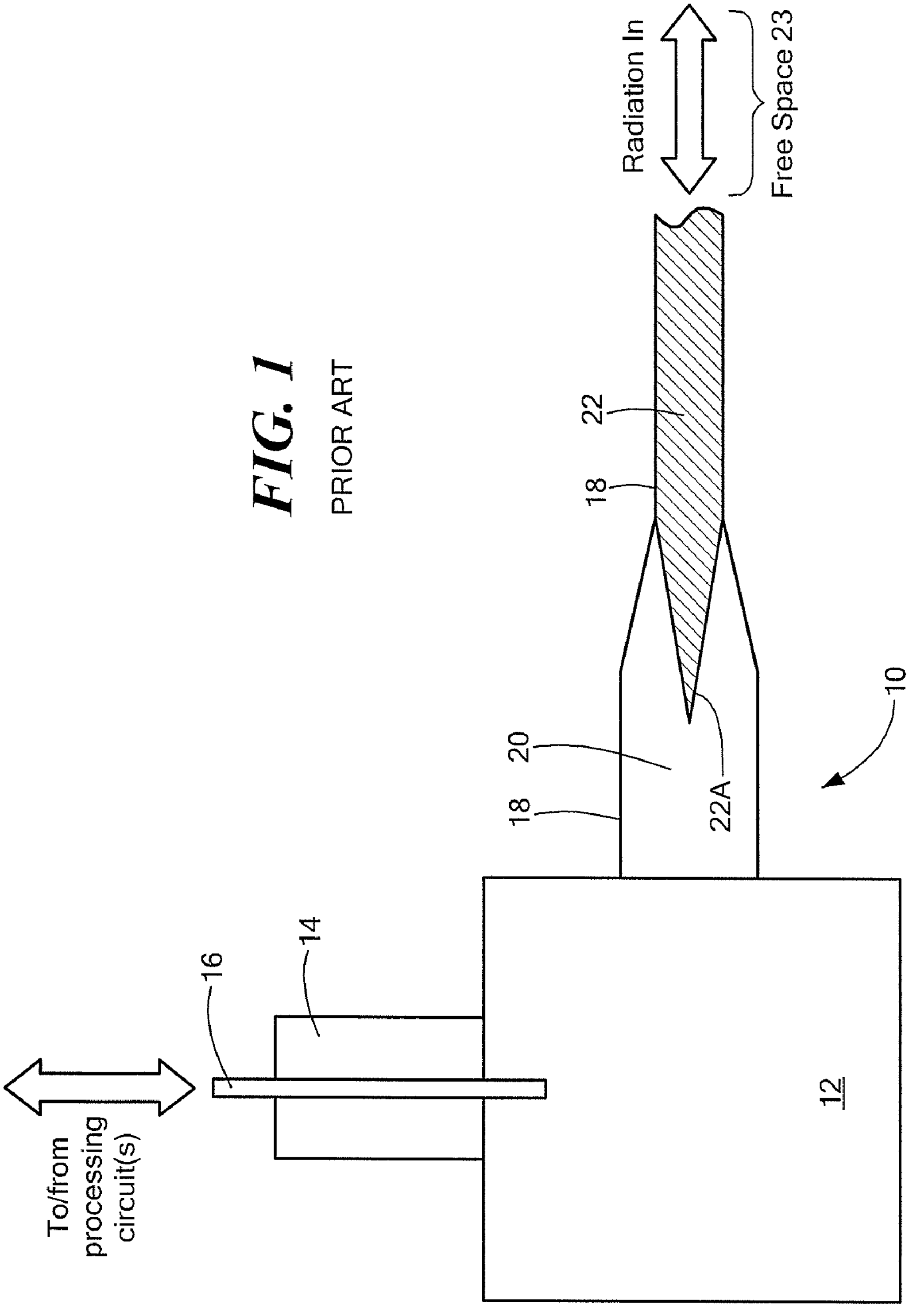
FIG. 1 PRIOR ART
FIG. 1 is an illustration of a prior art waveguide to coaxial transition.

In the drawings, like reference numbers indicate like elements. The drawings are not necessarily to scale, emphasis instead generally being placed upon illustrating the principles of the invention. The above reference to first, second, third, and fourth steps are in no way indicative of any required order of manufacturing steps.

DETAILED DESCRIPTION

In the following description, many dimensions, relative dimensions, etc., are expressed in terms of wavelengths, such as where $\lambda_0$ (or, as applicable, $\lambda_L$ for the low-band or $\lambda_H$ for the high-band) is used to indicate the wavelength at the middle of the operating frequency band. As those of skill in the art are aware, the wavelength is dependent on the antenna frequency and/or frequency band in question. It is intended that the dimensions and relative dimensions given herein are applicable over a number of bands and wavelengths, and it is not intended for the invention to be limited to any particular wavelengths. For example, the embodiments of the invention can be constructed for virtually any required frequency, by scaling the size of the device based on the wavelength that corresponds to the frequency being used. Thus, if an embodiment lists an overall device length, for example, of one wavelength ($\lambda$), a first further embodiment for a device at a first frequency may be about three inches long to correspond with a first wavelength of 3", whereas a different embodiment for a device used at a second frequency is scaled to 8" long to correspond to a wavelength that is that long.

In at least one embodiment, the invention is especially advantageous for a dual-band antenna that includes (but is not limited to) high-band elements radiating in the X band (approximately 7 GHz to 12.5 GHz) and low-band elements radiating in the S band (approximately 2 GHz to 4 GHz). However, those of skill in the art will readily appreciate that the invention has applicability in and can be adapted to work with many other frequency bands, including but not limited to L band (approximately 1-2 GHz), C band (approximately 4 GHz to 8 GHz), Ku band (approximately 12 GHz to 18 Ghz), K band (approximately 18 GHz to 24 GHz), Ka band (approximately 24-40 GHz), Q band (approximately 40-60 GHz) and mm bands (approximately 40-300 GHz). As those of skill in the art will appreciate, adapting the embodiments of the invention disclosed herein to work with other frequency bands may require, for example, changing the relative sizes of the elements of the invention (as certain features are sized based on wavelength). In addition, the invention is especially advantageous where the ratio of the high-band to the low-band is about 2.5:1 to 5:1.

In accordance with one embodiment of the invention, a compact loaded-waveguide radiating element for the low-band is provided that has been designed to meet at least some of the aforementioned requirements, which requirements included integrating low-band elements into a high-band array so that all high and low-band elements share the same aperture while both bands could be scanned to wide angles, providing a compact low-band element to minimize interference to high-band performance, and having desired wide scan angle performance over a broad bandwidth.

In one aspect, a difficult challenge met by at least one embodiment of the inventive design described herein is being able to limit the height of the low-band radiating aperture to be approximately only 0.06 wavelengths ($\lambda_L$) (where $\lambda_L$ is the wavelength in the middle of the low-band operating frequency band) so that it can fit in between high-band radiators, without increasing the high-band element spacing. This is further shown in FIG. 2, which is an illustration of an antenna array 50 constructed using the low-band elements described herein, in accordance with an embodiment of the invention.

Figure 2:
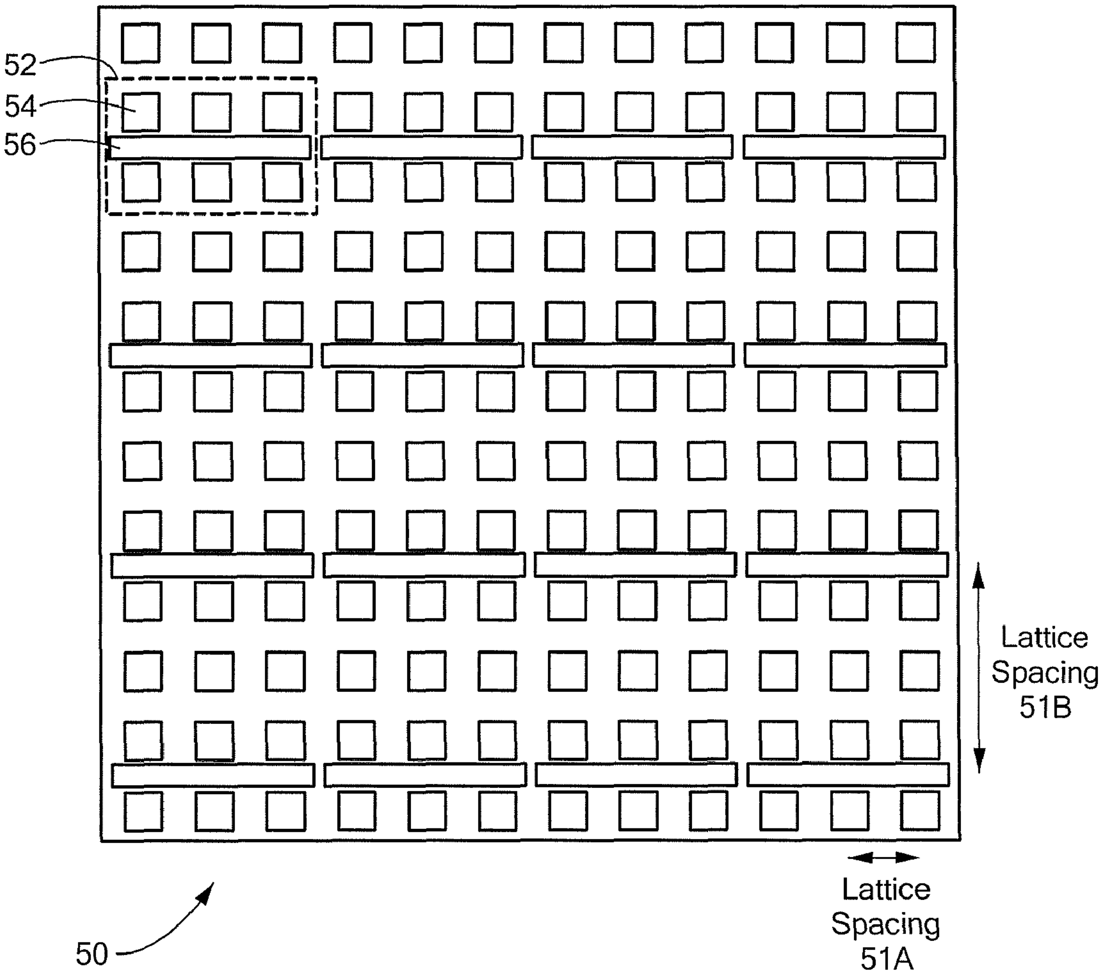
FIG. 2 is an illustration of a dual-band antenna array constructed using the high-band and low-band elements, in accordance with an embodiment of the invention.

Referring briefly to FIG. 2, the antenna array 50 includes a plurality of high-band elements 54 and a plurality of compact low-band elements 56. In an exemplary embodiment of the antenna array 50, there would be thousands of low-band elements and tens of thousands of high-band elements, but this example is not limiting. The illustrative grouping of elements 52 of the antenna array 50 is further detailed in FIGS. 3 and 4, described further below. The high-band radiating elements 54 of this exemplary embodiment are substantially square in shape, with each side measuring about $\lambda/4$, but this dimension (and the square shape itself) is not limiting. The lattice spacing 51A between high-band radiating elements is about $\lambda/2$ wavelengths (e.g., $0.5\lambda_H$) at high-band frequency, where $\lambda_H$ is the wavelength in the middle of the high-band operating frequency band. Similarly, the lattice spacing 51B between low-band radiating elements also is about $\lambda/2$ wavelengths (e.g., $0.5\lambda_L$) at low-band frequency, where $\lambda_L$ is the wavelength in the middle of the low-band operating frequency band. For an exemplary embodiment where the high-band corresponds to X band (i.e., a wavelength of 2.75-3 cm or 1.1 inches to 1.2 inches), this results in a high-band element measuring from 0.275 inches on a side to 0.3 inches on a side, with a high-band element spacing between about 0.55 inches to 0.6 inches.

Advantageously, in one embodiment, the width of the low-band element 56 (taken along the x-axis, see FIG. 4) is less than $0.5\lambda_L$ at the middle of the low-band operating frequency band (note that the height of the low-band element, as indicated above, is approximately only 0.06 wavelengths ($\lambda_L$)), where $\lambda_L$ corresponds to the wavelength at the middle of the low-band operating frequency band. The overall length of the low-band element 56 of this embodiment is approximately $1\lambda_L$ including a coax to waveguide transition 75 (which is described further herein), but not including the coax 62 itself. For an illustrative embodiment having a low-band element operating in S band, this length of $1\lambda_L$ results in an element being about 3 to 6 inches long, 1.5 to 3 inches wide and only 0.18 to 0.36 inches high. Another feature of the antenna array 50, in one advantageous embodiment, is either (or both) of the element spacings 51A, 51B is selected to help ensure that the scan loss should be less than 2.0 dB plus $\cos^{1.5}(\theta)$ (where θ is the scan angle), at maximum scan angle (>60°) over a large bandwidth (>15%).

For example, in one embodiment, the element spacing is limited to 0.5λ (one half wavelength) at both high-band and low-bands, to ensure a wide scan angle with limited scan loss. As those of skill in the art will appreciate, the dimensions of the high-band element ultimately affect the dimensions of the low-band element. In one advantageous embodiment, the high-band element is limited to a maximum size of $\lambda_H/4$ (e.g., one side length of a square-shaped high-band element), to ensure that there is sufficient room for the low-band aperture. Generally, for at least some embodiments of the invention, the height of the low-band radiating aperture is approximately one half of the side length of the high-band element.

Figure 3:
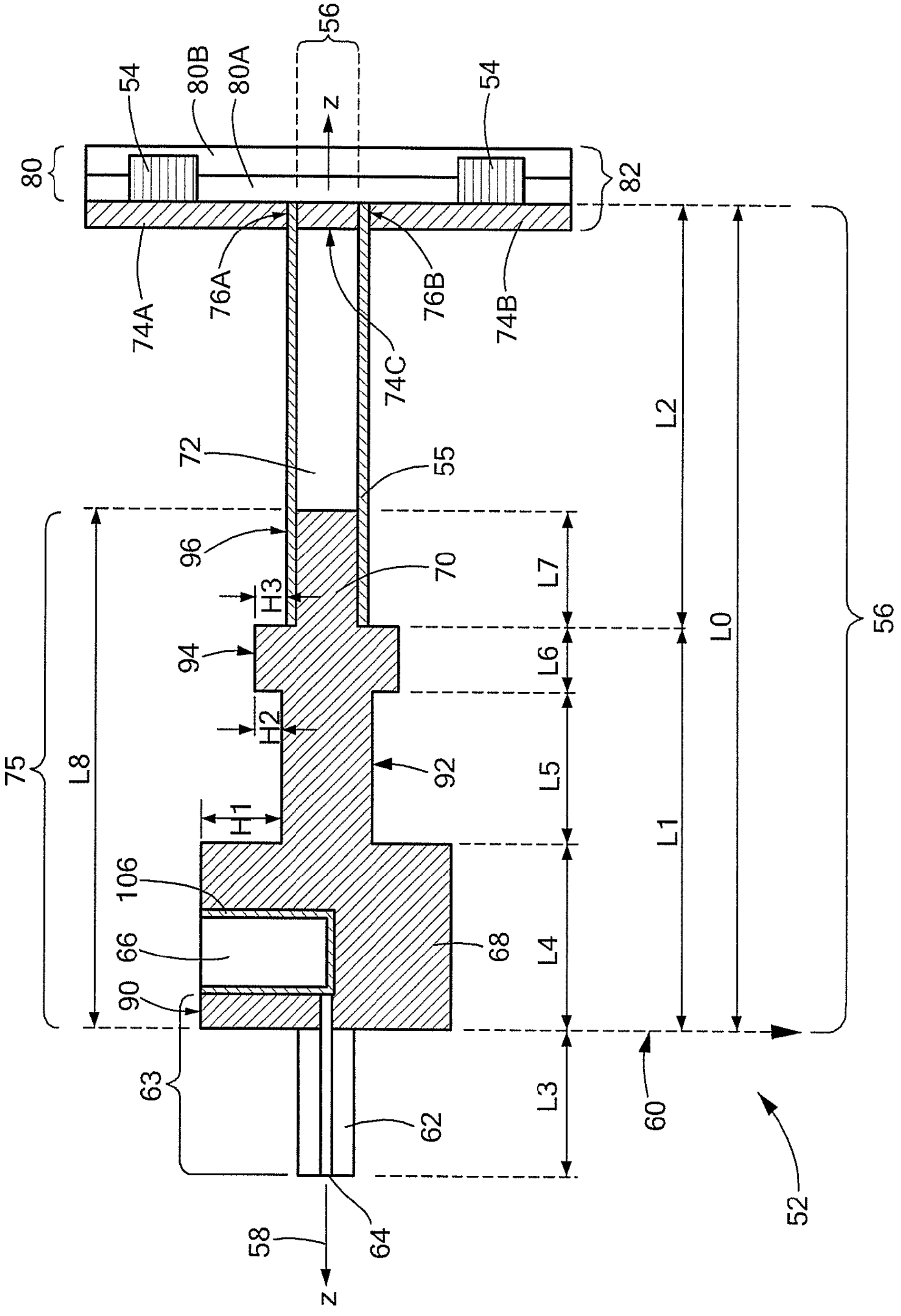
FIG. 3 is a side view of a Compact Low-band Loaded Waveguide Element, in accordance with an embodiment of the invention.
Figure 4:
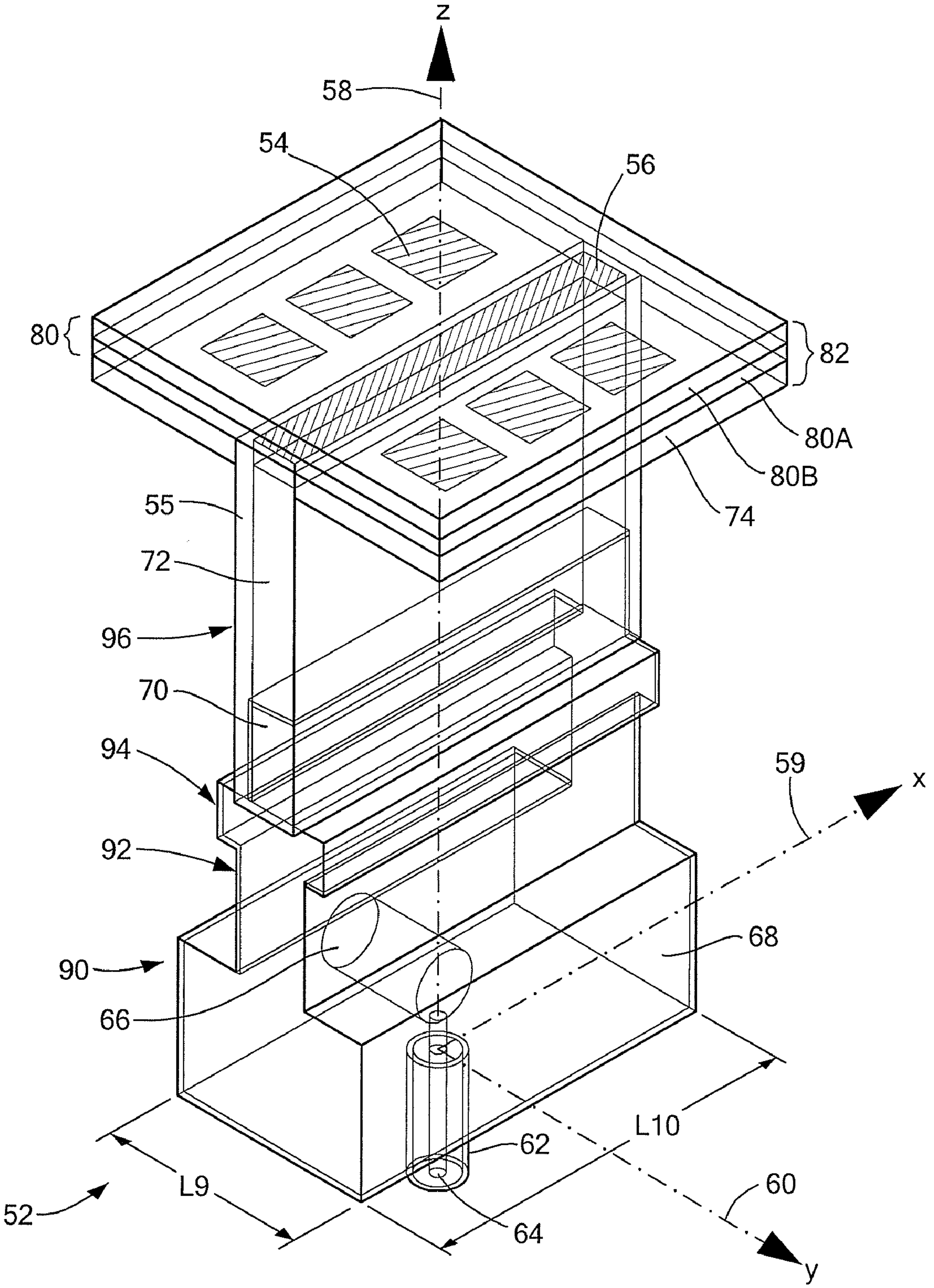
FIG. 4 is an isometric view of the Compact Low-band Loaded Waveguide Element of FIG. 3, with 6 high-band elements included.

For one embodiment, a loaded waveguide approach is used due to its low loss and wide bandwidth performance. FIG. 3 is a side view of the grouping of elements 52 of FIG. 2, along the z axis 58 and y axis 60, including in particular the compact low-band loaded-waveguide element 56, in accordance with an embodiment of the invention. FIG. 4 is an isometric view of the grouping of elements 52 of FIG. 2, along the x-axis 59, y-axis 60, and z-axis 58. Referring to FIGS. 3 and 4, the grouping of elements 52 of FIG. 3 includes a hollow rectangular waveguide portion 55, a coax to waveguide transition and impedance matching portion 75, and a board portion 82 (which portion includes the high-band elements 54, in between which the low-band element 56 is disposed or interleaved). Although the embodiments of the invention shown herein use a rectangular shaped waveguide (i.e., a waveguide having a substantially rectangular cross-sectional shape), the invention is not so limited. The invention is usable with other waveguide shapes that have a high aspect ratio (e.g., an elliptical shape) to the cross-sectional shape, such that the waveguide is able to fit into a very limited area between high-band elements. For example, a high aspect ratio for a rectangular cross-section waveguide is a cross-section where width is 7-8 times the height. For an elliptical cross-section waveguide, a high aspect ratio cross-section is one where the major axis is 7-8 times the size of the minor axis.

The low-band element 56 includes a dielectric portion 68 having several step transitions (also known in the art as step junctions) 92, 94, 96 (which are described further herein). The dielectric portion 68 includes a waveguide portion 70 that is inserted into waveguide 55, and is shown with slightly modified shading in FIG. 3, but it should be understood that this waveguide portion 70 is part of the same solid block of dielectric forming the remainder of the dielectric portion 68. The step transitions of the low-band element 56 are designed to reduce the low-band element height from the coax transition to the aperture. For example, in a low-band falling into the S band, the step transitions of the low-band element 56 bring the element height from about $0.25\lambda_L$ at the coax transition to about $0.06\lambda_L$ at the aperture. In one advantageous embodiment, the step transitions of the low-band element 56 are designed to provide a 75% reduction in element height, but this amount of reduction is not limiting. It can be difficult (but not impossible) to achieve a reduction in element height greater than 75%.

In addition, the low-band element 56 of FIGS. 3 and 4 is innovative at least in part because the low-band element 56 is compact, with a very small aperture (~$0.06\lambda_L$ in height) (taken along the y-axis, see FIG. 4), allowing it to be fit in between high-band elements 54 without physical interference. The overall length L0 of the low-band element 56 (taken along the z-axis, as shown in FIGS. 3 AND 4), in one embodiment, is only approximately $1\lambda_L$ including the coax to waveguide transition 75, which is another innovative feature. For example, with a low-band in the S-band range (corresponding to wavelengths of 7.5-15 cm (or 3 inches to 6 inches), this results in an aperture of approximately 0.18" to 0.36", and an overall element length of 3 inches to 6 inches.

Generally, the illustrated dimensions of the low-band element 56 of FIGS. 3 and 4, while not limiting, are approximately in scale to at least one advantageous embodiment of the invention. As those of skill in the art will appreciate, the lengths, heights, and numbers of step transitions (discussed further below) are selected to provide the impedance matching that is required. The number of steps shown is not limiting, but the number and dimensions of those illustrated are selected to provide the best possible impedance matching that fits within the size constraints for the low-band element 56. As those of skill will appreciate, increasing the number and/or size of step transitions may improve impedance matching further, but at increased size of the low-band element 56, which is not desirable if the element advantageously is to fit between high-band elements without interference, as has been discussed herein.

The innovative coax to waveguide transition and impedance matching portion 75 of the low-band element 56 is designed to make the low-band element 56 easily producible while having good impedance match. Production of this coax to waveguide transition 75 is described further below in connection with FIGS. 7 and 8. Referring again to FIGS. 3 and 4, the coax to waveguide transition portion 75 of the low-band element 56 includes a coax section 63, including a coaxial dielectric sleeve 62 and coaxial center conductor 64 that extends into the dielectric section. The coax to waveguide transition 75 also includes one step 96 that could be inserted into waveguide 55 via the waveguide portion 70 of dielectric.

Instead of using a traditional coax to waveguide adaptor, which typically is too large for phased array application, the dielectric section 68 also includes a very compact and innovative adaptor. It includes an opening or hole 66 (which in the illustrated embodiments is substantially cylindrical) to be formed (e.g., for a cylindrically-shaped hole, drilled) within of the first machined section 84 (see FIG. 7 herein), which in the exemplary embodiments herein also is substantially cylindrical, and formed in the first dielectric section 68. In the illustrated embodiments herein, the cylindrical hole 66 is located so as to be substantially perpendicular to the axis 58 of the coaxial conductor 62 (FIG. 3). The inventors have found that locating the hole 66 in a position that is substantially perpendicular to the axis 58 of the coaxial conductor 62 helps to provide the best balance of impedance matching and limiting overall size. Positioning the hole 66 at different angles also is usable with at least some embodiments of the invention, although the resultant impedance matching may not be the same as that provided by a substantially perpendicular position. In addition, positioning the hole 66 at an angle may increase overall size of the element 56. If size is not a concern, then angling the hole 66 may be acceptable in a given embodiment.

In addition, although the hole 66 is illustrated and described herein as being substantially cylindrical, the invention is not so limited. It has been found that having a hole 66 with a substantially cylindrical shape is readily manufactured (e.g., via drilling), but other shaped holes are usable, as well. After the hole 66 is formed in the machined section 84, the surfaces of the cylindrical hole 66 are metallically plated with plating material 106 (FIG. 7), enabling the cylindrical hole 66 to function like a metallic post, to provide the desired inductance and capacitance for impedance matching. That is, the substantially cylindrical hole 66 functions like a metallic post, which means that, as with a metallic post, electromagnetic energy cannot penetrate through the substantially cylindrical hole 66. In addition, at least one of the orientation, lining, shape and size of the substantially cylindrical hole 66 is selected to provide impedance matching to the coaxial section 63. The center conductor 64 of the coax will be then inserted into a second machined section 86 (see FIG. 7) (which also can be cylindrical, but is not required to be) and connected (e.g., via conductive adhesive 98 (see FIG. 8) to this plated "post" (i.e., plated substantially cylindrical hole 66 at the end of the coax center conductor 64.)

As those of skill in the art will appreciate, instead of forming the substantially cylindrical hole 66, a similarly positioned and sized metallic post could be used in its place. Use of such a metallic post may increase the overall weight of the element 56 and may require additional manufacturing steps, as will be appreciated.

As discussed further herein, a series of steps in the first dielectric section 68 and ending at the second dielectric section 70 also serve as a compact way to match the coax to waveguide adaptor 75 to a compact radiating element. The first dielectric section 68 includes a first step transition, 92, a second step transition 94, and a third step transition 96 (the third step transition 96 is disposed within the waveguide 55).

Referring again to FIGS. 3 and 4 (and also to FIGS. 5-9), the following listing provides some illustrative (but not limiting) dimensions for the illustrated embodiment of FIGS. 3 through 9, where the illustrative dimensions are provided in terms of $\lambda_L$, where $\lambda_L$ is the wavelength at the middle of the operating frequency band for low-band. In addition, it will be appreciated that these dimensions are approximate and can vary to some extent, as appreciated by those of skill in the art, without affecting the functioning of the illustrated embodiments. The length L0 of the low-band element 56 is approximately $1\lambda_L$. The length L1 of the dielectric section 68 that is exterior to the waveguide 55 is approximately $0.47\lambda_L$ wavelengths. The length L2 of the waveguide is approximately $0.53\lambda_L$ wavelengths. The length L3 of the dielectric sleeve 62 is approximately $0.17\lambda_L$ wavelengths. The length L4 of the first portion 90 of dielectric material 68 (prior to the first step 92) is approximately $0.22\lambda_L$ wavelengths. The length L5 of the first step 92 is approximately $0.17\lambda_L$ wavelengths. The height H1 of the step down from the first portion 90 of dielectric material 68 to the first step 92 is approximately $0.08\lambda_L$ wavelengths. The length L6 of the second step 96 is approximately $0.08\lambda_L$ wavelengths. The height H2 of the step up from the first step 92 to the second step 94 is approximately $0.02\lambda_L$ wavelengths. The length L7 of the third step 96 (which also corresponds to the second portion 70 of dielectric material 68, the portion that partially fills the waveguide 55) is approximately $0.14\lambda_L$ wavelengths. The height H3 of the step down from the third step 94 to the fourth step 96 is approximately $0.04\lambda_L$ wavelengths.

Continuing with dimensional references, the length L8 of the dielectric section 68 is approximately $0.61\lambda_L$ wavelengths. The thickness L9 of the dielectric section 68 near its connection to the coax connector 62 is approximately $0.27\lambda_L$ wavelengths. The depth L1 of the dielectric section 68 is approximately $0.48\lambda_L$ wavelengths. The length L11 of the board section 74C that is between the slots 76 is approximately $0.06\lambda_L$ wavelengths. The length L12A and width 12B of the boards 74 and 80 are both $0.5\lambda_L$ wavelengths. The height L13 of the hole 66 is approximately $0.15\lambda_L$ wavelengths. The diameter L14 of the hole 66 is approximately $0.07\lambda_L$ wavelengths. The height L15 of the waveguide 55 is approximately $0.06\lambda_L$ wavelengths (essentially corresponding to the length L11 of the board section 74C that is between slots 76). The length L16 of the waveguide 55 is approximately $0.53\lambda_L$ wavelengths.

The waveguide portion 55 of the low-band element 56 is formed using an open rectangular waveguide that is partially filled with dielectric material (i.e., the second dielectric section 70 of the dielectric portion 68). As indicated previously, the sections 68 and 70 are formed from the same piece of dielectric material, which in an advantageous embodiment is quartz. The waveguide 55, in one embodiment, is made of aluminum. The waveguide 55 also includes an air section 72. As FIGS. 3 and 4 illustrate, much of the volume of the low-band element 56 is loaded with a dielectric material 70 (e.g., quartz) to shrink its overall size, including the loading of the coax to waveguide transition portion 75, which includes the loaded portion 70 of the waveguide 55. The air section 72 of the waveguide 55 is implemented to provide shunt inductance for conjugate impedance matching with a highly capacitive aperture. First and second dielectric portions 68 and 70, respectively, are highly capacitive, so the waveguide 55 needs a high inductive section, provided by the air section 72 of the waveguide 55, to cancel out the reactance portion of the impedance to match with the free space, which, as is well-known, is 377 ohms in resistance, with no reactance at all. As those of skill in the art will appreciate, the size of the loaded portion of waveguide 55 (i.e., second dielectric portion 70) will vary based on the impedance matching, and generally the size of the loaded portion of waveguide 55 will be large enough to provide impedance matching. In the illustrated embodiment, the waveguide 55 itself is approximately $0.53\lambda_L$ wavelengths and the length of the portion of dielectric 70 filling the waveguide 55 is approximately $0.14\lambda_L$ wavelengths, showing that, for one embodiment, the waveguide 55 fills about 26% of the length of the waveguide (but this is not limiting).

The opening of waveguide 55 of the low-band element is covered by dielectric layer 74 that has been bonded to the high-band array 80 (to form a board layer 82). The dielectric layer 74 serves as another dielectric section at the radiator aperture. The dielectric layer 74 is, in one embodiment, made from a material capable of being bonded to the high-band array 80. The dielectric layer 74 could, in some embodiments, be made of quartz, but it is preferably made of a material capable of being bonded to the high-band array.

Figure 6:
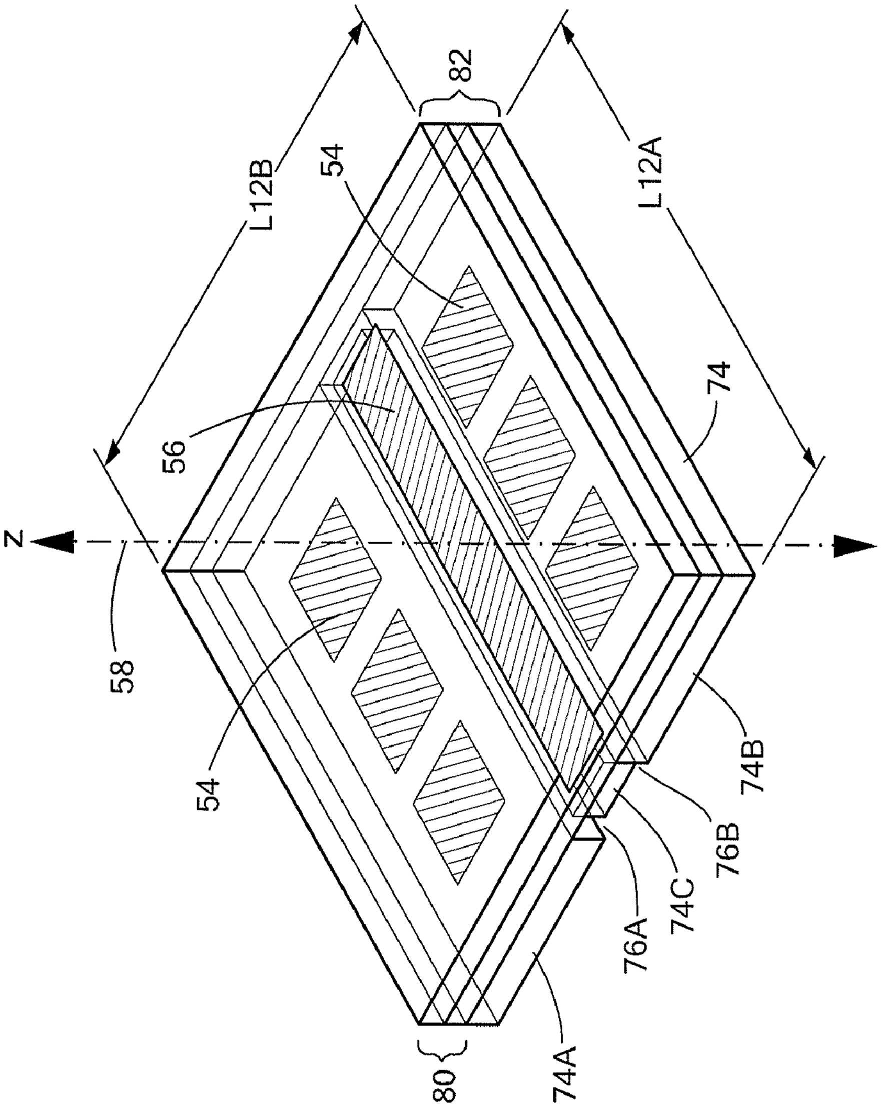
FIG. 6 is an isometric view of the first step of FIG. 5.
Figure 5:
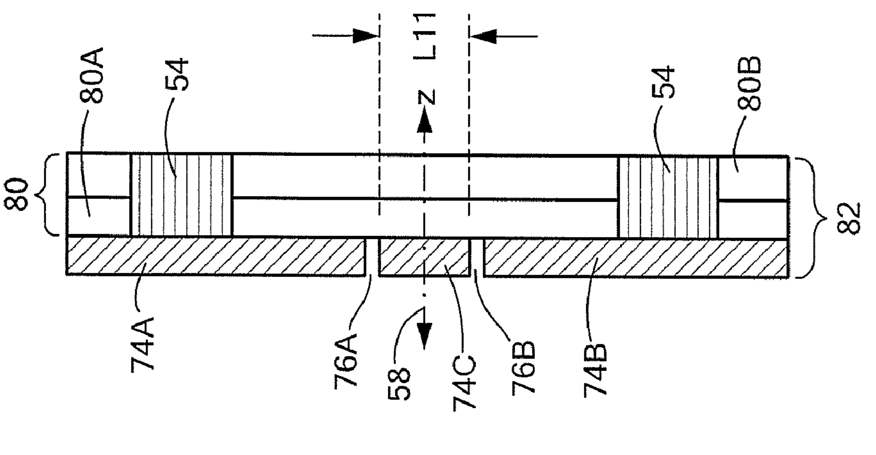
FIG. 5 is a side view showing a first step of the manufacture of the Compact Low-band Loaded Waveguide of FIG. 3.

FIG. 5 is a side view and FIG. 6 is an isometric view, showing how the dielectric board layer 74 is bonded to the high-band array 80 and how slots 76A, 76B are formed in the dielectric board layer 74 for the waveguide 55. Referring briefly to FIGS. 5 and 6, the dielectric board layer 74 is routed with two slots 76A, 76B, and the location and dimensions of these slots match very closely (ideally, exactly) the exterior dimensions of the empty waveguide 55. As those of skill in the art will appreciate, depending on the shape of the waveguide 55 used, the size and orientation of the slots will vary. For example, the slots could be sized to mate with a waveguide having a high aspect ratio, such as an elliptical waveguide. During assembly of the low-band element 56, the empty (i.e., unloaded) waveguide 55 is inserted into the slots 76A, 76B. It also will be appreciated that an assembly is possible wherein the finished dielectric portion 68 (e.g., FIG. 7) is inserted into waveguide 55 prior to the waveguide 55 being coupled to the board layer, but generally for manufacturing it may be easier to insert the empty unloaded waveguide 55 into the slots 76A, 76B first. Note also that the high-band array 80 is illustrated in FIGS. 3-6 as being formed of two boards 80A, 80B that have been coupled together, which is a typical multi-layer design for high-bandwidth arrays. In addition, the materials for the board 74 and the high-band board 80 also act as an impedance transformer from the waveguide 55 to free space, so these boards are part of the low-band impedance matching network. Furthermore, the slots 57 provide a way to integrate both the low-band elements 56 and the high-band elements 54 by inserting the low-band waveguide 55 into the slots 76.

Figure 7:
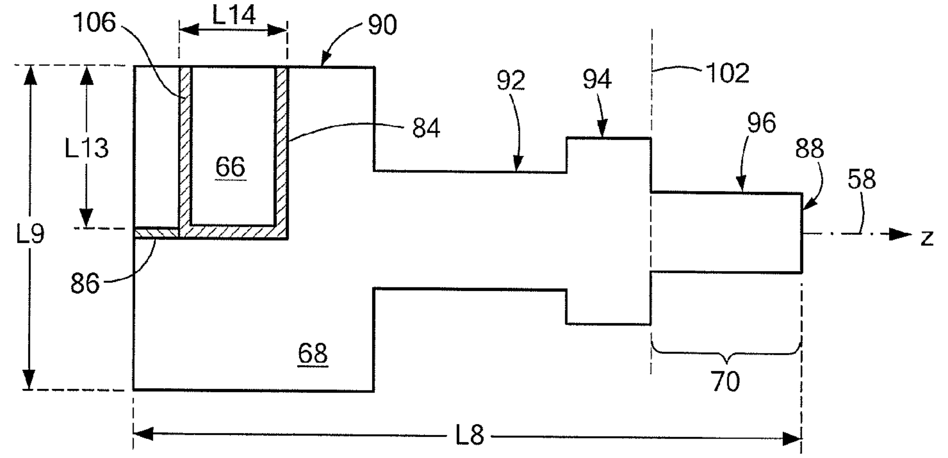
FIG. 7 is a side view showing the second step of the manufacture of the Compact Low-band Loaded Waveguide of FIG. 3.

FIG. 7 is a side view showing the formation of the dielectric portion 68 of the low-band element 56. A block of dielectric material (e.g., quartz) is machined to have the illustrated shape of the dielectric portion 68 shown in FIG. 7, including step transitions 92, 94, and 96. The waveguide-filling section 70 of the dielectric portion 68 (which is to the right of dotted line 102) is machined so as to fit inside and fill (but not completely fill) at least a portion of the waveguide 55 being used (see, e.g., FIG. 9, which is a cross-sectional view of an open rectangular waveguide 55, into which the waveguide portion 70 is to be inserted). Referring again to FIG. 7, after the block of dielectric material is machined into the dielectric portion 68 shape, first and second sections 84, 86, respectively, are formed. For ease of manufacturing, the sections 84, 86 are substantially cylindrical to facilitate manufacture by drilling, but the invention is not so limited. Other shapes for the sections 84, 86 are possible, such as square, rectangular, triangular, elliptical, etc., so long as the required impedance matching results (for section 84) or so long as the coaxial conductor is able to make electrical contact (for section 86). The circular end 88 of the step 96 is masked with a paper (to avoid having a "short" inside the waveguide 55), then all other surfaces of the entire piece of dielectric 68 are plated with metallic material, such as copper or silver. This will make the section 84, which is plated with metallic material 106 to create opening or hole 66, to function like a metallic post to provide impedance matching with the coaxial conductor pin 64 (not shown in FIG. 7) that is to be inserted into the second cylindrical section 86. The hole 66 also provides some capacitance. The second cylindrical section 86 is sized to be able to receive and hold securely the coaxial conductor pin 64, while enabling the coaxial conductor pin 64 to make electrical contact with the conductive material 106.

Figure 8:
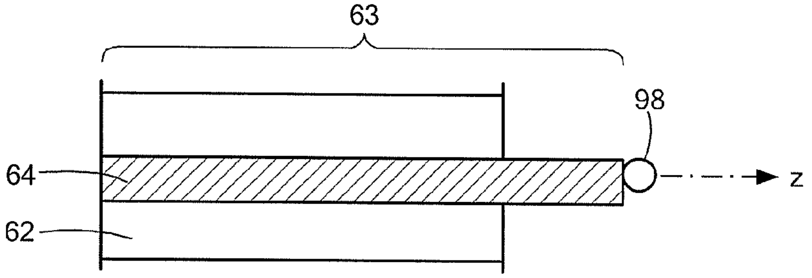
FIG. 8 is a side view showing the third step of the manufacture of the Compact Low-band Loaded Waveguide of FIG. 3.
Figure 9:
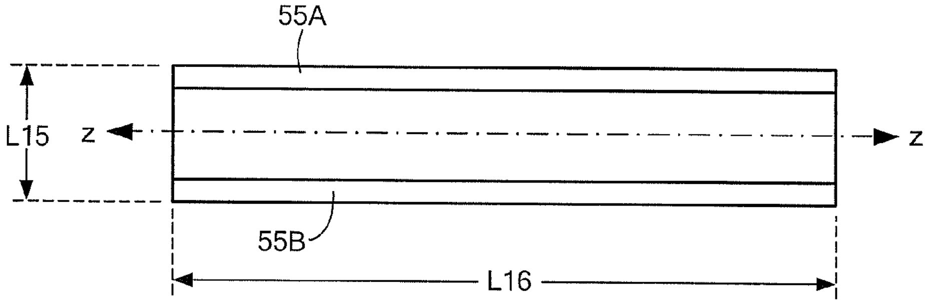
FIG. 9 is a side view showing the fourth step of the manufacture of the Compact Low-band Loaded Waveguide of FIG. 3.

FIG. 8 is a side view further illustrating assembly of the coax section 63 of the low-band element. A coax center pin 64 (made from an appropriate conductive material) is cut to a desired length (which length enables the coax center pin 64 to at least project into the second cylindrical section 86 (FIG. 7) of the dielectric portion 68. A TEFLON sleeve 62, as is known in the art, surrounds the coax center pin 64. Conductive adhesive 98 (e.g., silver epoxy) is applied to the projecting portion of the coax center pin 64 and the coax center pin 64 is inserted into the cylindrical section 86 of the quartz body (located at the back of the quartz body). The sizes and locations for conductive adhesive 98 shown in FIG. 8 are merely illustrative and not limiting. After the coax center pin 64 is inserted to the machined dielectric portion 68, and after one end of the open waveguide 55 is inserted to the slots 76A, 76B of the board layer, the dielectric portion 68 is inserted into the other end of the open waveguide, to partially fill the waveguide 55 with dielectric material, resulting in the low-band element as shown in FIGS. 3 and 4.

Figure 10:
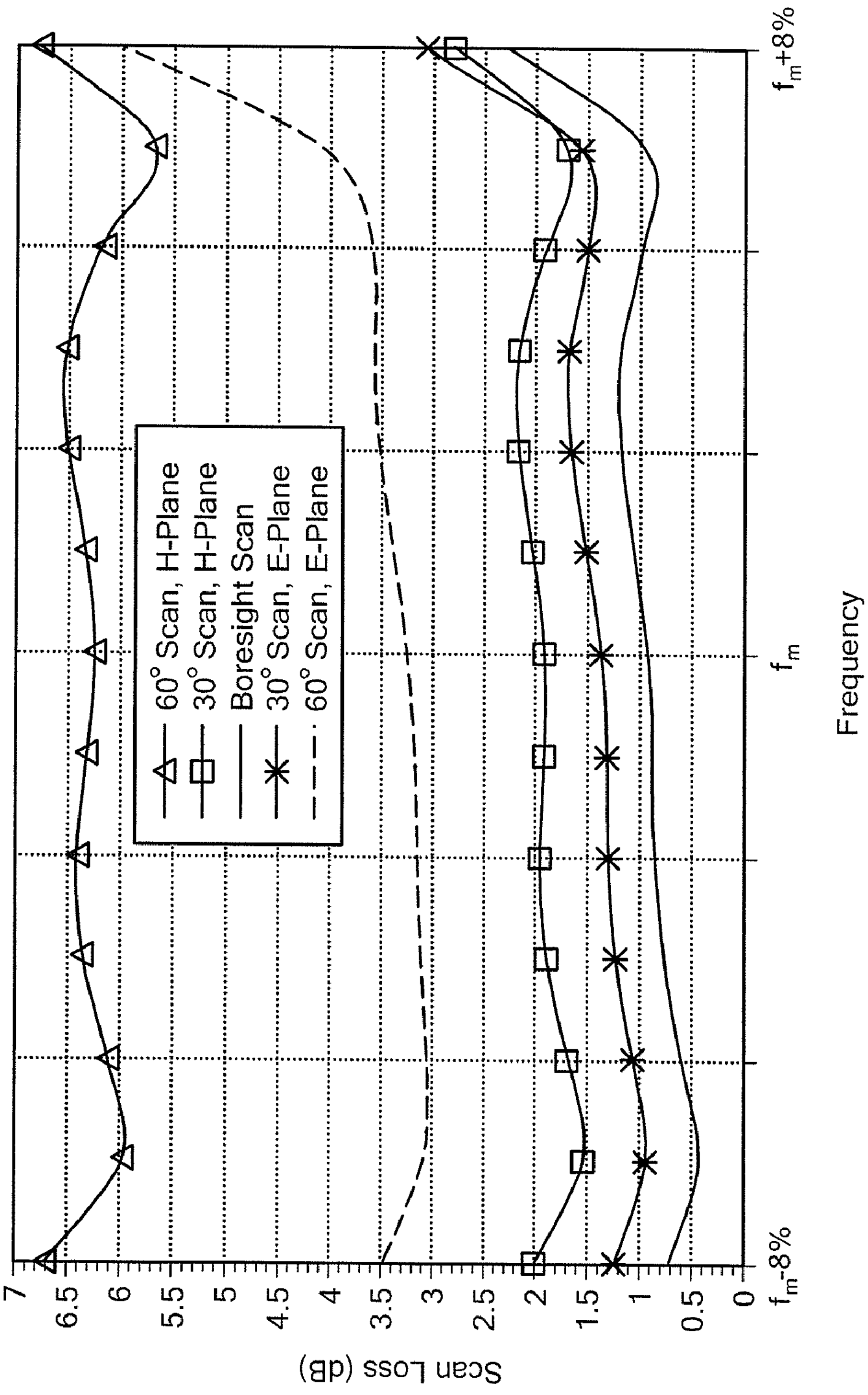
FIG. 10 is a graph showing Calculated Scan Loss of the Design at Low-band (>15% bandwidth) using HFSS, in accordance with an embodiment of the invention.

Good simulation results have been obtained using HFSS (which is a three-dimensional full-wave electromagnetic field simulation software product available from ANSOFT of Pittsburgh, Pa.) and PARANA (a rigorous finite element modeling tool). Very good agreement between HFSS and PARANA has been achieved for boresight, 30°, and 60° scan angles in the E- and H-planes. Some of the calculated HFSS results are shown in FIG. 10, which is a graph showing Calculated Scan Loss of the Design at Low-band (>15% bandwidth), in accordance with an embodiment of the invention.

It is believed that the embodiments of the invention described herein are innovative for a number of different reasons. For example, it is believed that that no other known phased array element design has such a small radiating aperture (relative to frequency) while providing good scan performance at wide scan angles over a very wide bandwidth. In addition, it is believed that the coax to waveguide transition 75 described herein is more compact than known designs, and unique in its particular design. In addition, the low-band element designs described herein are configured and arranged for easy fabrication and low cost manufacturing processes. For example, traditional board lay-up, machining, and plating could be used to produce this element as shown in FIGS. 3 and 4.

Throughout the present disclosure, absent a clear indication to the contrary from the context, it should be understood individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Similarly, in addition, in the Figures of this application, in some instances, a plurality of system elements may be shown as illustrative of a particular system element, and a single system element or may be shown as illustrative of a plurality of particular system elements. It should be understood that showing a plurality of a particular element is not intended to imply that a system or method implemented in accordance with the invention must comprise more than one of that element, nor is it intended by illustrating a single element that the invention is limited to embodiments having only a single one of that respective elements. In addition, the total number of elements shown for a particular system element is not intended to be limiting; those skilled in the art can recognize that the number of a particular system element can, in some instances, be selected to accommodate the particular user needs.

In describing the embodiments of the invention illustrated in the figures, specific terminology (e.g., language, phrases, etc.) may be used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, processes, military programs, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention. Those of ordinary skill in the art will appreciate that the embodiments of the invention described herein can be modified to accommodate and/or comply with changes and improvements in the applicable technology and standards referred to herein. Variations, modifications, and other implementations of what is described herein can occur to those of ordinary skill in the art without departing from the spirit and the scope of the invention as claimed.

The particular combinations of elements and features in the above-detailed embodiments are exemplary only; the interchanging and substitution of these teachings with other teachings in this and the referenced patents/applications are also expressly contemplated. Although the foregoing description makes reference to various embodiments of the invention, the invention is not limited to specific described embodiments. In addition, although embodiments of the invention may achieve advantages over other possible solutions and/or over the prior art, whether or not a particular advantage is achieved by a given embodiment is not limiting of the invention. As those skilled in the art will recognize, variations, modifications, and other implementations of what is described herein can occur to those of ordinary skill in the art without departing from the spirit and the scope of the invention as claimed. The technology disclosed herein can be used in combination with other technologies. Accordingly, the foregoing description is by way of example only and is not intended as limiting. Likewise, reference to "the invention" or to any "innovative" aspects of the embodiments described herein should not be construed as a generalization of any inventive subject matter disclosed herein and should not be considered to be an element or limitation of the appended claims except where explicitly recited in a claim(s).

In addition, all publications and references cited herein are expressly incorporated herein by reference in their entirety.

Having described and illustrated the principles of the technology with reference to specific implementations, it will be recognized that the technology can be implemented in many other, different, forms, and in many different environments. Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims. The invention's scope is defined in the following claims and the equivalents thereto.

What is claimed is:

1. An array antenna constructed and arranged to operate at a high-band wavelength $\lambda_H$ and a low-band wavelength $\lambda_L$, the antenna comprising:

a first array comprising a plurality of high-band radiators, each high-band radiator constructed and arranged to radiate at $\lambda_H$, at least a portion of the high-band radiators having a first predetermined spacing between each other;

a second array comprising a plurality of low-band radiators, each respective low-band radiator in the plurality being disposed so as to be interleaved between the high-band radiators and being sized to fit within the first predetermined spacing so as to share an aperture with the high-band radiators, each low-band radiator having an input and output and each respective low-band radiator comprising:

a coaxial section disposed at the input to the low-band radiator, the coaxial section being constructed and arranged to provide a coaxial connection adapted to receive radiated signals, wherein the coaxial connection comprises a coaxial conductor;

a dielectric section operably coupled to the coaxial section via the coaxial conductor, the dielectric section being formed of a continuous piece of dielectric material and cooperating with the coaxial section and a waveguide to provide a coaxial to waveguide transition, wherein the dielectric section comprises:

a first opening sized to receive the coaxial conductor;

a second opening formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening; and a plurality of step transitions disposed after the first portion of the dielectric section, the plurality of step transitions cooperating to provide impedance matching and reduce the height of the respective low-band radiator from a first height at the input to the respective low-band radiator to a second height at the output of the respective low-band radiator, wherein at least one of the step transitions is adapted to be disposed within the waveguide and to be operably coupled between the dielectric section and a planar section, wherein the at least one step transition partially fills an interior first portion of the waveguide at a first waveguide end, wherein at least a second portion of the waveguide adjacent to the first portion is filled with air, and wherein the size of the step transition that partially fills the waveguide is selected at least in part to provide impedance matching between the dielectric section and the waveguide the waveguide operably coupled to the dielectric section, the waveguide having first and second waveguide ends, the first waveguide end being operably coupled to the dielectric section and the second waveguide end being operably coupled to a planar section; and the planar section disposed at the output of the low-band radiator, the planar section operably coupled to the second waveguide end of the waveguide and further operably coupled to at least a portion of the first array of high-band radiators, wherein the planar section is oriented to the portion of high-band radiators such that the output of the respective low-band radiator is disposed between and within the spacing between adjacent high-band-radiators, such that the low-band radiator and the high-band radiators share the same aperture.

2. The antenna of claim 1, wherein the low-band radiator is constructed and arranged to have an overall height less than or equal to $0.06\lambda_L$, a width less than or equal to $0.5\lambda_L$, and a length less than or equal to $\lambda_L$.

3. The antenna of claim 1, wherein the first predetermined spacing is selected to limit a scan loss of the antenna to less than 2.0 dB plus $\cos^{1.5}(\theta)$, where θ is the scan angle of the first array.

4. The antenna of claim 1, wherein the low-band elements are spaced a second predetermined spacing apart from each other, wherein the second predetermined spacing is selected to limit the scan loss of the antenna to less than 2.0 dB plus $\cos^{1.5}(\theta)$, where θ is the scan angle of the second array.

5. The antenna of claim 1, wherein each high-band radiator has a side length and each low-band radiator has a height, wherein the height of the low-band radiator is approximately half the height of the high-band radiator.

6. The antenna of claim 1, wherein the plurality of step transitions further comprises:

a first step transition disposed near the second opening and spaced approximately $0.22\lambda_L$ from the coaxial section that is coupled to the dielectric section, the first step transition having a step down height of approximately $0.08\lambda_L$ and a length of approximately $0.47\lambda_L$;

a second step transition disposed adjacent to the first step transition, the second step transition having a step up height of approximately $0.02\lambda_L$ and a length of approximately $0.08\lambda_L$; and a third step transition disposed adjacent to the second step transition, the third step transition having a step down height of $0.04\lambda_L$ and a length of approximately $0.14\lambda_L$, wherein the third step transition corresponds to the step transition that is disposed within and partially fills the waveguide.

7. The antenna of claim 1, wherein the waveguide has a cross-section wherein the width is at least approximately 7 times the height.

8. The antenna of claim 1, wherein the first portion of the dielectric section has a length of approximately $0.22\lambda_L$.

9. The antenna of claim 1, wherein at least one of the orientation, lining and size of the second opening is selected to provide impedance matching to the coaxial section.

10. The antenna of claim 1, where the high-band corresponds to a frequency range that is approximately 2.5 to 5 times the size of the frequency range of the low-band.

11. The antenna of claim 1, wherein the high-band wavelength and the low-band wavelength are each associated with a respective one of the following frequency bands: X band, S band, L band, C band, Ku band, K band, Ka band, Q band, and mm band.

12. The antenna of claim 1, wherein at least one of the high-band radiating array and the low-band radiating array has a size and spacing enabling the antenna to be operable to scan at scan angles greater than or equal to sixty degrees from boresight with a bandwidth greater than or equal to 15%.

13. The antenna of claim 1, wherein the antenna is a phase array antenna.

14. An antenna element having an input and output, the antenna element comprising:

a coaxial section disposed at the input, the coaxial portion being constructed and arranged to provide a coaxial connection adapted to receive radiated signals, wherein the coaxial connection comprises a coaxial conductor;

a dielectric section operably coupled to the coaxial section via the coaxial conductor, the dielectric section being formed of a continuous piece of dielectric material and cooperating with the coaxial section and a waveguide to provide a coaxial to waveguide transition, wherein the dielectric section comprises:

a first opening sized to receive the coaxial conductor;

a second opening formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening; and a plurality of step transitions disposed after the first portion of the dielectric section, the plurality of step transitions cooperating to provide impedance matching and reduce the height of the coaxial to waveguide transition from a first height at the input to the coaxial to waveguide transition to a second height at the output of the coaxial to waveguide transition, wherein the reduction in height from the first height to the second height comprises a reduction in the height of the coaxial to waveguide transition of at least 24%, wherein at least one of the step transitions is adapted to be disposed within the waveguide and to be operably coupled between the dielectric section and a planar section, wherein the at least one step transition partially fills an interior first portion of the waveguide at a first waveguide end, wherein at least a second portion of the waveguide adjacent to the first portion is filled with air, and wherein the size of the step transition that partially fills the waveguide is selected at least in part to provide impedance matching between the dielectric section and the waveguide;

the waveguide operably coupled to the dielectric section, the waveguide having first and second waveguide ends, the first waveguide end operably coupled to the dielectric section and the second waveguide end operably coupled to a planar section; and a planar section disposed at the output, the planar section being operably coupled to the second waveguide end.

15. The antenna element of claim 14, wherein the antenna element is adapted to operate over at least a wavelength λ, wherein the antenna element is constructed and arranged to have an overall height less than or equal to 0.06λ, a width less than or equal to 0.5λ, and a length less than or equal to λ.

16. The antenna element of claim 14, wherein the plurality of step transitions further comprises:

a first step transition disposed near the second opening and spaced approximately 0.22λ from the coaxial section that is coupled to the dielectric portion, the first step transition having a step down height of approximately 0.08λ and a length of approximately 0.47λ;

a second step transition disposed adjacent to the first step transition, the second step transition having a step up height of approximately 0.02λ and a length of approximately 0.08λ; and a third step transition disposed adjacent to the second step transition, the third step transition having a step down height of 0.04λ and a length of approximately 0.14λ, wherein the third step transition corresponds to the step transition that is disposed within and partially fills the waveguide.

17. The antenna of claim 14, wherein at least one of the orientation, lining and size of the second opening is selected to provide impedance matching to the coaxial section.

18. A coaxial to waveguide transition having first and second ends and comprising:

a coaxial section at the first end, the coaxial section being constructed and arranged to provide a coaxial connection adapted to receive radiated signals, wherein the coaxial connection comprises a coaxial conductor;

a dielectric section operably coupled to the coaxial section via the coaxial conductor, the dielectric section being formed of a continuous piece of dielectric material and cooperating with the coaxial section and a waveguide to provide a coaxial to waveguide transition, wherein the dielectric section comprises:

a first opening sized to receive the coaxial conductor;

a second opening formed in an orientation that is substantially perpendicular to the first opening, the second opening being formed in a first portion of the dielectric section, wherein the second opening is substantially hollow and has a lining comprising an electrically conductive material that is operably coupled to the coaxial conductor disposed in the first opening; and a plurality of step transitions disposed after the first portion of the dielectric section, the plurality of step transitions cooperating to provide impedance matching and reduce the height of coaxial to waveguide transition from a first height at the first end to a second height at the second end, wherein the reduction in height from the first height to the second height comprises a reduction in the height of the coaxial to waveguide transition of at least 24%, wherein at least one of the step transitions is adapted to be disposed within and to partially fill a waveguide operably coupled to the dielectric section, wherein the size of the step transition that partially fills the waveguide is selected at least in part to provide impedance matching between the dielectric section and the waveguide; and the waveguide operably coupled to the dielectric section, the waveguide having first and second waveguide ends, the first waveguide end operably coupled to the dielectric section and the second waveguide end located at the output of the waveguide.

19. The coax to waveguide transition of claim 18, wherein the coax to waveguide transition is adapted to operate over at least a wavelength λ, wherein the plurality of step transitions further comprises:

a first step transition disposed near the second opening and spaced approximately 0.22λ from the coaxial section that is coupled to the dielectric portion, the first step transition having a step down height of approximately 0.08λ and a length of approximately 0.47λ;

a second step transition disposed adjacent to the first step transition, the second step transition having a step up height of approximately 0.02λ and a length of approximately 0.08λ; and a third step transition disposed adjacent to the second step transition, the third step transition having a step down height of 0.04λ and a length of approximately 0.14λ, wherein the third step transition corresponds to the step transition that is disposed within and partially fills the waveguide.

20. The coax to waveguide transition of claim 18, wherein at least one of the orientation, lining and size of the second opening is selected to provide impedance matching to the coaxial section.

* * * * *